US006806210B2

United States Patent
Shiho et al.

(10) Patent No.: US 6,806,210 B2
(45) Date of Patent: Oct. 19, 2004

(54) TANTALUM OXIDE FILM, USE THEREOF, PROCESS FOR FORMING THE SAME AND COMPOSITION

(75) Inventors: Hiroshi Shiho, Tokyo (JP); Hitoshi Kato, Tokyo (JP); Sachiko Hashimoto, Tokyo (JP); Isamu Yonekura, Tokyo (JP); Yasuo Matsuki, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/181,778

(22) PCT Filed: Nov. 7, 2001

(86) PCT No.: PCT/JP01/09739

§ 371 (c)(1),
(2), (4) Date: Jul. 22, 2002

(87) PCT Pub. No.: WO02/43131

PCT Pub. Date: May 30, 2002

(65) Prior Publication Data

US 2003/0003235 A1 Jan. 2, 2003

(30) Foreign Application Priority Data

Nov. 21, 2000 (JP) .................................... 2000-353898
Feb. 21, 2001 (JP) .................................... 2001-045379

(51) Int. Cl.$^7$ .................. H01L 21/31; H01L 21/469
(52) U.S. Cl. .................. 438/785; 438/758; 438/685; 427/126.3
(58) Field of Search ................. 438/785, 758, 438/685; 427/58, 126.3, 383.3

(56) References Cited

U.S. PATENT DOCUMENTS 5,811,153 A * 9/1998 Hashimoto et al. ........... 427/58

FOREIGN PATENT DOCUMENTS

| EP | 800165 | 10/1997 |
| JP | 59-78929 | 5/1984 |
| JP | 59-181413 | 10/1984 |
| JP | 64-2669 | 1/1989 |
| JP | 2000-173094 | 6/2000 |
| JP | 2001-291283 | 10/2001 |

OTHER PUBLICATIONS

Oyo Buturi, vol. 69, No. 9, pp. 1067–1073 and p. 1121, "Applied Physics", 2000 (with partial English translation).

K. Hidekimi, No. 7, pp. 18–23 and p. 120, "Electronic Materials", 2000 (with partial English translation).

U.S. patent application Ser. No. 10/181,778, Shiho et al., filed Jul. 22, 2002.

U.S. patent application Ser. No. 10/396,518, Shiho et al., filed Mar. 26, 2003.

* cited by examiner

Primary Examiner—Alexander Ghyka
(74) Attorney, Agent, or Firm—Oblon, Spivak, McClelland, Maier & Neustadt, P.C.

(57) ABSTRACT

A composition for forming a high-quality tantalum film which is advantageously used as an capacitor insulating film and a process for forming the high-quality tantalum film. The composition for forming a tantalum oxide film, which comprises at least one tantalum compound selected from the group consisting of a reaction product of a compound capable of reacting with a tantalum alkoxide and a tantalum alkoxide and a hydrolyzate of the reaction product, and a solvent, and the process for forming the tantalum oxide film by applying this composition to a substrate and heating it.

29 Claims, 8 Drawing Sheets

F I G. 4
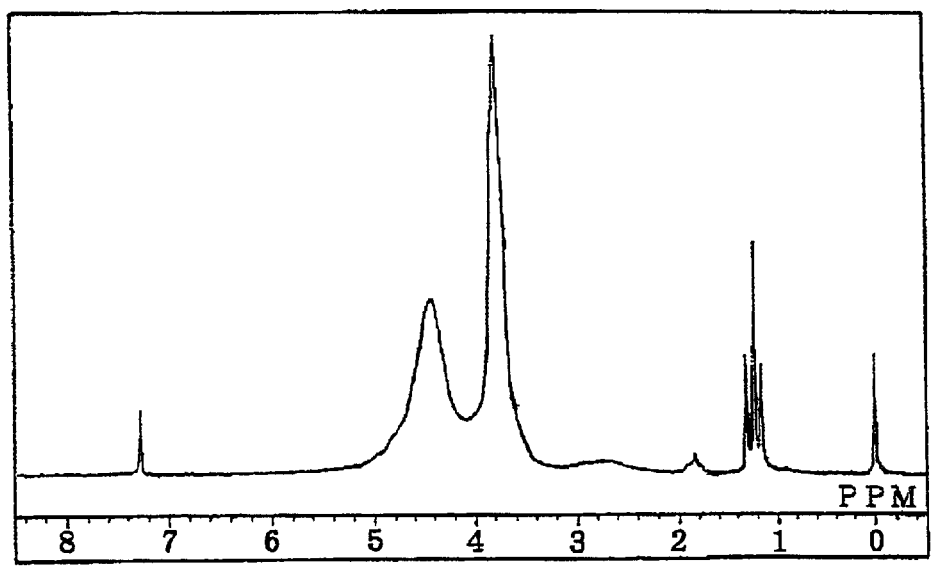

TANTALUM OXIDE FILM, USE THEREOF, PROCESS FOR FORMING THE SAME AND COMPOSITION

FIELD OF THE INVENTION

The present invention relates to a composition for forming a tantalum oxide film, a process for forming a tantalum oxide film, a tantalum oxide film and use thereof. More specifically, it relates to a composition for forming a tantalum oxide film suitable for use as an insulating film for semiconductor devices, such as a capacitor insulating film or a gate insulating film for use in DRAMs, a tantalum oxide film, a process for forming the same and use of a tantalum oxide film as an insulating film.

PRIOR ART

The area of a capacitor in a DRAM (Dynamic Random Access Memory) has been becoming smaller due to increases in the integration and density of a semiconductor device. When the capacity becomes smaller as the area of a capacitor decreases, the erroneous operation of a device may occur due to a software error or the like. Therefore, even when the area of the capacitor decreases, a sufficient capacity must be ensured. One of the means of solving this problem is to use an insulating film having a high dielectric constant (high dielectric film) as a capacitor insulating film. A $SiO_2$ or $Si_3N_4$ film has been used as a capacitor insulating film and capacity has been ensured by a 3-D memory cell structure. However, due to a recent tendency to rapidly increase the integration and reduce the design rule of a DRAM, it is becoming difficult to ensure the capacity of a memory cell with prior art methods.

Tantalum oxide is characterized in that it has a dielectric constant 3 times or more higher than $SiO_2$ and $Si_3N_4$ which have been used in capacitor insulating films and a thin film thereof having excellent step coverage can be easily deposited by CVD. Therefore, researches into tantalum oxide as the next-generation DRAM capacitor insulating film are now under way.

The method of forming a tantalum oxide insulating film by CVD is disclosed in Applied Physics 69(9), p. 1067 (2000). Various studies on tantalum materials used for CVD are reported in Electronic Materials, No. 7, p. 18 (2000).

However, tantalum oxide insulating films formed by these prior art methods contain large quantities of impurities and oxygen defect due to their raw materials and film forming methods, which causes a leak current and reduces dielectric breakdown. A tantalum alkoxide used as a raw material to form a film by CVD has problems that its hydrolyzability is high and that impurities such as carbon remain in the film in large quantities.

Further, film formation by CVD requires a bulky apparatus which is expensive itself and consumes a large amount of energy for vacuum and plasma systems, thereby boosting product costs.

SUMMARY OF THE INVENTION

It is an object of the present invention to provide a tantalum-containing composition for forming a high-quality tantalum oxide film easily and effectively, which solves the above problems, and a process for producing the composition.

It is another object of the present invention to provide a high-quality tantalum oxide film and a process for forming the same.

It is still another object of the present invention to provide use of a tantalum oxide film.

Other objects and advantages of the present invention will become apparent from the following description.

MEANS FOR SOLVING THE PROBLEM

According to the present invention, firstly, the above objects and advantages of the present invention are attained by a composition for forming a tantalum oxide film, comprising at least one tantalum-containing product selected from the group consisting of (A1) a reaction product of (a1) a tantalum alkoxide and (a2) at least one compound selected from the group consisting of an amino alcohol, compound having two or more hydroxyl groups in the molecule (excluding amino alcohols), β-diketone, β-ketoester, ester of β-dicarboxylic acid, lactic acid, ethyl lactate and 1,5-cyclooctadiene and (A2) a hydrolyzate of the reaction product.

According to the present invention, secondly, the above objects and advantages of the present invention are attained by a process for forming a tantalum oxide film, comprising applying the above composition to the surface of a substrate and subjecting it to a heat treatment and/or an optical treatment.

Thirdly, the above objects and advantages of the present invention are attained by a tantalum oxide film formed by the above process.

Fourthly, the above objects and advantages of the present invention are attained by an insulating film for semiconductor devices, which has a tantalum oxide film formed by the above process.

BRIEF DESCRIPTION OF THE DRAWINGS

FIG. 4 is an $^1$H-NMR spectrum diagram of a white solid obtained in Synthetic Example 10;

DETAILED DESCRIPTION OF THE PREFERRED EMBODIMENTS

Component (a1)

Figure 1:
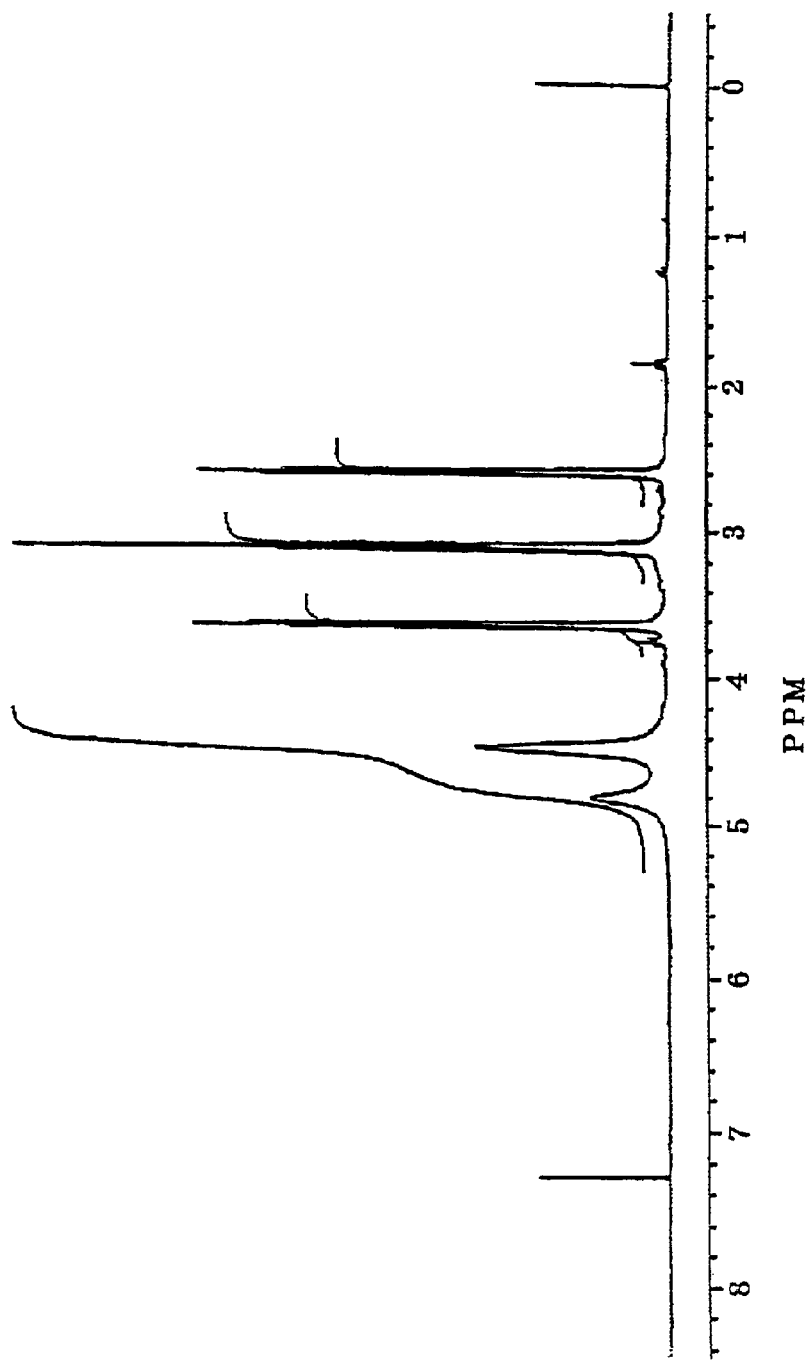
FIG. 1 is an NMR spectrum diagram of a product obtained in Synthetic Example 1.

The tantalum alkoxide (a1) used in the present invention is preferably a compound represented by the following formula (1):

$$Ta(OR)_5 \qquad (1)$$

wherein R is an alkyl group having 1 to 6 carbon atoms and five R's may be the same or different.

Illustrative examples of the tantalum alkoxide include tantalum pentamethoxide, tantalum pentaethoxide, tantalum pentaisopropoxide and tantalum pentabutoxide. Out of these, tantalum pentaethoxide, tantalum pentaisopropoxide and tantalum pentabutoxide are preferred. These tantalum alkoxides may be used alone or in combination of two or more.

Component (a2)

The component (a2) used in the present invention is at least one compound selected from the group consisting of an amino alcohol, compound having two or more hydroxyl group in the molecule (excluding amino alcohols), β-diketone, β-ketoester, ester of β-dicarboxylic acid, lactic acid, ethyl lactate and 1,5-cyclooctadiene.

Examples of the compound having two or more hydroxyl groups in the molecule (excluding amino alcohols) include alcohols having two or more hydroxyl groups in the molecule (excluding amino alcohols) and phenols having two or more hydroxyl groups in the molecule.

Out of the above compounds, amino alcohols, alcohols having two or more hydroxyl groups in the molecule (excluding amino alcohols) and phenols having two or more hydroxyl groups in the molecule are preferred, and amino alcohols and alcohols having two or more hydroxyl groups in the molecule (excluding amino alcohols) are more preferred.

The above amino alcohols include triethanolamine, diethanolamine, triisopropanolamine, diisopropanolamine, methyldiethanolamine and ethydiethanolamine. Out of these, triethanolamine and diethanolamine are particularly preferred.

Examples of the alcohols having two or more hydroxyl groups in the molecule (excluding amino alcohols) include dialcohols such as ethylene glycol, propylene glycol, butanediol, pentanediol, hexanediol, heptanediol, octanediol, nonanediol, decanediol, diethylene glycol, bistrimethylene glycol, glycerol monomethyl ether, glycerol monoethyl ether and hydroquinone; and polyhydric alcohols such as glycerol. Out of these, diethylene glycol, butanediol and pentanediol are particularly preferred.

Examples of the phenols having two or more hydroxyl groups in the molecule include polyhydric phenols such as catechol, resorcin, hydroquinone and phloroglucin. Out of these, hydroquinone is particularly preferred.

Examples of the above β-diketone include acetylacetone, propionylacetone, methyl diacetylmethane, dipropionylmethane, n-butyrylacetone, isobutyrylacetone, 3-methyl-2,4-hexanedione, diacetylethylmethane, n-valerylacetone, propionyl-n-butyrylmethane, 3-methyl-2, 4-hexanedione, diacetylethylmethane, n-valerylacetone, propionyl-n-butyrylmethane, 3-methyl-2,4-heptanedione, isovalerylacetone, pivaloylacetone, isopropyldiacetylmethane, caproylacetone, di-n-butyrylmethane, 2,2,6,6-tetramethyl-3,5-heptanedione, benzoylacetone, 3-phenyl-2,4-pentanedione, dibenzoylmethane, ethoxycarbonyldiacetylmethane and 1,1, 1,5,5,5-hexafluoro-2,4-pentanedione. Out of these, acetylacetone and propionylacetone are particularly preferred.

Examples of the above β-ketoester include methyl acetoacetate, ethyl acetoacetate and methyl-α-methyl acetoacetate. Out of these, methyl acetoacetate and ethyl acetoacetate are particularly preferred.

Examples of the above β-dicarboxylate include dimethyl malonate, diethyl malonate, dibutyl malonate, dihexyl malonate, dioctyl malonate, diundecyl malonate, dihexadecyl malonate, di-9-octadecyl malonate, di-9,12-octadecadienyl malonate and di-9,11,13-octadecatrienyl malonate. Out of these, dimethyl malonate and diethyl malonate are particularly preferred.

The above compounds may be used alone or in combination of two or more.

The reaction between the tantalum alkoxide (a1) and the component (a2) is carried out by using the component (a2) in an amount of preferably 0.1 to 1,000 mols, more preferably 0.5 to 100 mols, particularly preferably 1 to 10 mols based on 1 mol of the tantalum alkoxide (a1).

The reaction temperature may be preferably −30 to 150° C., more preferably 0 to 100° C., particularly preferably 0 to 70° C. The reaction pressure is normal pressure, optionally under increased pressure or reduced pressure.

The reaction between the tantalum alkoxide (a1) and the component (a2) may be carried out in the presence of a monoalcohol (excluding amino alcohols) and/or a monophenol.

Illustrative examples of the monoalcohol (excluding amino alcohols) include methanol, ethanol, propanol, isopropanol, butanol, tert-butanol, hexanol, cyclohexanol, octanol, ethylene glycol monomethyl ether, ethylene glycol monoethyl ether, ethylene glycol monoisopropyl ether, diethylene glycol monomethyl ether, diethylene glycol monoethyl ether, propylene glycol monomethyl ether, propylene glycol monoethyl ether, glycerol dimethyl ether and glycerol diethyl ether.

Illustrative examples of the monophenol include phenol, methyl phenol, dimethyl phenol, trimethyl phenol, ethyl phenol, diethyl phenol and triethyl phenol.

Out of these, phenol, methyl phenol and ethyl phenol are preferred.

When the reaction between the tantalum alkoxide (a1) and the component (a2) is carried out in the presence of a monoalcohol (excluding amino alcohols) and/or a monophenol, the total amount of the monoalcohol and/or the monophenol is preferably 10 mols or less, more preferably 5 mols or less, particularly preferably 3 mols or less based on 1 mol of the component (a2). When the amount is larger than 10 mols, the reaction between the tantalum alkoxide (a1) and the component (a2) may be impeded.

The above reaction may be carried out in the presence of a solvent as required. When a solvent is used, a solvent which does not react with the tantalum alkoxide (a1), the component (a2) and the reaction product thereof is preferably used.

Illustrative examples of the solvent include hydrocarbon-based solvents such as n-pentane, cyclopentane, n-hexane, cyclohexane, n-heptane, cycloheptane, n-octane, cyclooctane, decane, cyclodecane, dicyclopentadiene hydride, benzene, toluene, xylene, durene, indene, tetrahydronaphthalene, decahydronaphthalene and squalane; ether-based solvents such as diethyl ether, dipropyl ether, dibutyl ether, ethylene glycol dimethyl ether, ethylene glycol diethyl ether, ethylene glycol methyl ethyl ether, diethylene glycol diethyl ether, diethylene glycol methyl ethyl ether, tetrahydrofuran, tetrahydropyran, 1,2-dimethoxyethane, bis(2-methoxyethyl)ether and p-dioxane; and polar solvents such as propylene carbonate, γ-butyrolactone, N-methyl-2-pyrrolidone, dimethyl formamide, acetonitrile, dimethyl sulfoxide, methylene chloride and chloroform.

Out of these, diethyl ether, dipropyl ether, dibutyl ether, tetrahydrofuran, dimethyl formamide, acetonitrile, dimethyl sulfoxide, methylene chloride and chloroform are particularly preferred.

These solvents may be used alone or in combination of two or more.

When the reaction between the tantalum alkoxide (a1) and the component (a2) is carried out in the presence of a solvent, the amount of the solvent is preferably 1 to 100 ml, more preferably 5 to 50 ml, particularly preferably 5 to 30 ml based on 1 g of the tantalum alkoxide (a1).

The above reaction product is assumed to be the following substance, for example:

i) a reaction product in which some or all of the alkoxyl groups of the tantalum alkoxide are eliminated, at least one hydroxyl group in the component (a2) loses its hydrogen atom, and the oxygen atom contained in the hydroxyl group losing its hydrogen atom is bonded to a tantalum atom when the component (a2) contains an amino alcohol, an alcohol having two or more hydroxyl groups in the molecule, a phenol having two or more hydroxyl groups in the molecule, lactic acid or ethyl lactate. When a plurality of hydroxyl groups in one molecule of the component (a2) take part in the reaction, tantalum atoms bonded to the hydroxyl groups may be the same or different.

ii) a reaction product in which some or all of the alkoxyl groups of the tantalum alkoxide are eliminated, a $CH_2$ group sandwiched between two carbonyl groups in the component (a2) loses its hydrogen atoms, the β-diketone structure losing the hydrogen atoms takes a resonance structure, and a chelate bond is formed at one tantalum atom when the component (a2) contains a β-diketone, β-ketoester or ester of β-dicarboxylic acid.

iii) a reaction product in which some or all of the alkoxyl groups of the tantalum alkoxide are eliminated, at least one carboxyl group in the component (a2) loses its hydrogen atom, and an oxygen atom contained in the carboxyl group losing its hydrogen atom is bonded to a tantalum atom when the component (a2) contains lactic acid. The carboxyl group losing its hydrogen atom may take a resonance structure and be chelate-bonded to one tantalum atom.

iv) a reaction product in which the two oxygen atoms of an ester group are bonded to a tantalum atom when the component (a2) contains ethyl lactate.

v) a reaction product in which an oxygen atom or nitrogen atom contained in the component (a2) and bonded to a tantalum atom is further bonded to a tantalum atom contained in another reaction product or an unreacted tantalum alkoxide in i) to iv).

vi) a composition in which some or all of the alkoxyl groups of the tantalum alkoxide are eliminated and at least one double bond contained in 1,5-cyclooctadiene is coordinately bonded to at least one tantalum atom when the component (a2) contains 1,5-cyclooctadiene.

vii) a reaction product in which an oxygen atom or nitrogen atom contained in the component (a2) or an unreacted product of a monoalcohol or monophenol optionally added is bonded to a tantalum atom contained in any one of the reaction products i) to vi).

viii) a reaction product in which a tantalum atom contained in any one of the reaction products i) to vii) is bonded to a tantalum atom contained in another reaction product or an unreacted tantalum alkoxide through an oxygen atom.

ix) a reaction product in which a tantalum atom contained in any one of the reaction products i) to viii) is crosslinked with a tantalum atom contained in another reaction product or a tantalum atom contained in an unreacted tantalum alkoxide through the oxygen atom of an alkoxyl group remaining in the reaction product or an alkoxyl group contained in the unreacted tantalum alkoxide.

x) a mixture of two or more of the above reaction products.

The newly formed bond may be, for example, a covalent bond, ionic bond, coordinate bond, hydrogen bond or intermediate bond therebetween.

The above reaction products may contain an unreacted alkoxyl group or an alkoxyl group obtained by an exchange reaction between an alkoxyl group contained in the tantalum alkoxide and a monoalcohol optionally added.

The above reaction products may contain an unreacted alkoxyl group or an alkoxyl group obtained by an exchange reaction between an alkoxyl group contained in the tantalum alkoxide and a monoalcohol optionally added (therefore, these may be generally referred to as "unreacted alkoxyl group" hereinafter).

The reaction product used as the component [A] in the present invention has a reaction conversion defined by the following equation (1) of 50 mol % or more, preferably 70 mol %, particularly preferably 85 mol % or more.

Reaction conversion={1−(total number of unreacted alkoxyl groups contained in reaction product/total number of alkoxyl groups contained in raw material tantalum alkoxide)}×100 (mol %)  (1)

When this value is smaller than 50 mol %, the electrical properties of the formed tantalum oxide film may become unsatisfactory.

The hydrolyzate of the above reaction product can be synthesized by heating the above reaction product at room temperature to 100° C. under agitation in the presence of preferably 0.01 to 1,000 mols of water based on 1 equivalent of the tantalum atom.

The hydrolyzate of the above reaction product includes a compound obtained by hydrolyzing all of the hydrolysable moiety and a partial hydrolyzate in which part of the hydrolysable moiety are hydrolyzed and other part of the moiety remains unhydrolyzed.

In the present invention, the above reaction products and hydrolyzates thereof may be used alone or in combination of two or more.

[B] Ester of Orthocarboxylic Acid

The composition of the present invention can further comprise [B] an ester of orthocarboxylic acid.

The ester of orthocarboxylic acid [B] reacts with water existent in environment to reduce the adverse effect of humidity in the atmosphere in the step of forming a tantalum oxide film from the composition of the present invention, particularly a composition which comprises the reaction product of the component (a1) and the component (a2) as the component (A). Therefore, a tantalum oxide film formed from the composition of the present invention containing the ester of orthocarboxylic acid [B] has high quality.

The mechanism that the ester of orthocarboxylic acid [B] reacts with water is assumed to be represented by the following formula (2):

$$R^1C(OR^2)_3 + 3H_2O \rightarrow R^1COOH + 3R^2OH + H_2O \quad (2)$$

wherein $R^1$ and $R^2$ are each an alkyl group or aryl group.

Illustrative examples of the ester of orthocarboxylic acid [B] include trimethyl orthoformate, triethyl orthoformate, tripropyl orthoformate, tributyl orthoformate, tripentyl orthoformate, diethylpropyl orthoformate, triphenyl orthoformate, trimethyl orthoacetate, triethyl orthoacetate, tripropyl orthoacetate, tributyl orthoacetate, tripentyl orthoacetate, diethylpropyl orthoacetate, triphenyl orthoacetate, trimethyl orthopropionate, triethyl orthopropionate, tripropyl orthopropionate, tributyl orthopropionate, tripentyl orthopropionate, diethylpropyl orthopropionate, triphenyl orthopropionate, trimethyl orthobutyrate, triethyl orthobutyrate, tripropyl orthobutyrate, tributyl orthobutyrate, tripentyl orthobutyrate, diethylpropyl orthobutyrate, triphenyl orthobutyrate, trimethyl ortholaurate, triethyl ortholaurate, tripropyl ortholaurate, tributyl ortholaurate, tripentyl ortholaurate, diethylpropyl ortholaurate, triphenyl ortholaurate, trimethyl orthobenzoate, triethyl orthobenzoate, tripropyl orthobenzoate, tributyl orthobenzoate, tripentyl orthobenzoate, diethylpropyl orthobenzoate, triphenyl orthobenzoate, trimethyl ortholactate, triethyl ortholactate, tripropyl ortholactate, tributyl ortholactate, tripentyl ortholactate, diethylpropyl ortholactate and triphenyl ortholactate.

Out of these orthocarboxylates, aliphatic esters are preferred from the viewpoint of reactivity with water, and methyl esters and ethyl esters are particularly preferred. Specifically, trimethyl orthoformate, triethyl orthoformate and trimethyl orthobenzoate are particularly preferred.

These ester of orthocarboxylic acids may be used alone or in combination of two or more.

The amount of the ester of orthocarboxylic acids [B] in the composition of the present invention may be suitably determined according to the water content of the composition and the ambient humidity in the step of forming a tantalum oxide film but preferably 0.05 to 50 wt %, more preferably 0.1 to 30 wt %, particularly preferably 0.5 to 20 wt % based on the composition.

The hydroxyl group of a carboxylic acid, alcohol or ortholactate formed by the reaction between water and an ester of orthocarboxylic acid may react with a film forming composition, which does not lessen the effect of the present invention.

Composition for Forming a Tantalum Oxide Film

The composition of the present invention is generally used as a solution composition containing the above components dissolved in a solvent.

The solvent which can be used in the present invention is not particularly limited if it dissolves the above components and does not react with these. Examples of the solvent include alcohol-based solvents such as methanol, ethanol, propanol, butanol, hexanol, cyclohexanol, octanol, decanol, ethylene glycol, ethylene glycol monomethyl ether, ethylene glycol monoethyl ether, ethylene glycol monoisopropyl ether, diethylene glycol monomethyl ether, diethylene glycol monoethyl ether, propylene glycol, propylene glycol monomethyl ether, propylene glycol monoethyl ether, propylene glycol monopropyl ether, glycerol, glycerol monomethyl ether, glycerol dimethyl ether, glycerol monoethyl ether and glycerol diethyl ether; and ester-based solvents such as ethylene glycol monomethyl ether acetate, ethylene glycol monoethyl ether acetate, propylene glycol monomethyl ether acetate, propylene glycol monoethyl ether acetate, methyl lactate and ethyl lactate in addition to the solvents which can be used for the reaction between (a1) the tantalum alkoxide and the component (a2).

These solvents may be used alone or in combination of two or more.

Out of these, alcohol-based solvents and mixed solvents of an alcohol-based solvent and another polar solvent are preferred from the viewpoints of the solubility of each component and the stability of the obtained composition.

Propylene glycol monomethyl ether, propylene glycol monoethyl ether and propylene glycol monopropyl ether are preferred as alcohol-based solvents. Mixed solvents of an alcohol-based solvent and an ether-based solvent and mixed solvents of an alcohol-based solvent and an ester-based solvent are preferred as mixed solvents of an alcohol-based solvent and another polar solvent.

The mixed solvents of an alcohol-based solvent and an ether-based solvent are preferably mixed solvents of at least one alcohol-based solvent selected from propylene glycol monomethyl ether, propylene glycol monoethyl ether and propylene glycol monopropyl ether and at least one ether-based solvent selected from bis(2-methoxyethyl)ether, diethylene glycol diethyl ether and diethylene glycol methyl ethyl ether.

The mixed solvents of an alcohol-based solvent and an ester-based solvent are preferably mixed solvents of at least one alcohol-based solvent selected from propylene glycol monomethyl ether, propylene glycol monoethyl ether and propylene glycol monopropyl ether and at least one ester-based solvent selected from propylene glycol monomethyl ether acetate and propylene glycol monomethyl ether acetate.

Although there are isomers of propylene glycol monoalkyl ethers out of these, all of them may be used and mixed solvents thereof may also be used.

When a solvent is used in the step of a reaction between the tantalum alkoxide (a1) and the component (a2), the solvent may be directly used as a solvent for the composition of the present invention without being removed, or removed after the reaction and then newly added after the purification of the reaction product of the tantalum alkoxide (a1) and the component (a2) as required. Alternatively, without removing the solvent used in the reaction step, a similar solvent may be further added to prepare the composition of the present invention.

When the solvent used contains what has a hydroxyl group, it may react with the residual alkoxyl group of the reaction product of the tantalum alkoxide (a1) and the component (a2), which does not lessen the effect of the present invention.

When the composition of the present invention contains a solvent, the amount of the solvent may be suitably determined according to the thickness of a desired coating film. However, the total amount of components other than the solvent in the composition is preferably 50 wt % or less, more preferably 0.5 to 50 wt %, much more preferably 1 to 30 wt %, particularly preferably 1 to 20 wt %.

The composition of the present invention may optionally contain a tantalum composition other than the above in order to increase the content of tantalum in the composition.

A fluorine-based, silicone-based or nonionic-based surface tension modifier may be optionally added to the composition of the present invention in limits that do not impair the function of interest.

The thus obtained composition may be suitably mixed with fine particles of a metal oxide such as aluminum oxide, zirconium oxide, titanium oxide or silicon oxide before use.

Process for Forming a Tantalum Oxide Film

A description is subsequently given of the process for forming a tantalum oxide film.

The above composition is applied to a substrate to form the coating film of the composition of the present invention. The surface of the substrate may be flat, uneven with a level difference or curved. The shape of the substrate is not particularly limited and may be block-like, plate-like or film-like.

The material of the substrate preferably stands the subsequent heat treatment step. Illustrative examples of the material of the substrate include glasses, metals, metal compounds, plastics, ceramics and laminates thereof. The glasses include quartz glass, borosilicate glass, soda glass and lead glass. The metals and metal compounds include gold, silver, copper, nickel, silicon, aluminum, iron, platinum, ruthenium, tungsten, titanium, cobalt, molybdenum, iridium, stainless steel, aluminum alloy, silicide, tantalum nitride, titanium nitride and ruthenium oxide. The plastics include polyimides, polyether sulfones, norbornene-based ring opening polymers and hydrides thereof.

The technique for applying the above solution is not particularly limited and may be carried on by suitable methods such as spin coating, dip coating, flow coating, curtain coating, roll coating, spray coating, bar coating, ink jetting or printing. The solution may be applied once or a plurality of times. The thickness of the coating film may be suitably determined according to the thickness of a desired tantalum oxide film. For example, the thickness of the coating film is preferably 0.001 to 10 μm, more preferably 0.005 to 1 μm. When the composition contains a solvent, the thickness of the coating film should be understood as the thickness of the coating film after the removal of the solvent.

The coating step in the present invention is preferably carried out at an ambient humidity (content of water vapor in the atmosphere) of 5 g/m$^3$ or less, preferably 3 g/m$^3$. When the humidity is higher than 5 g/m$^3$, it may exert a bad influence upon the insulating properties of the formed tantalum oxide film.

When the composition of the present invention comprises a predetermined amount of an ester of orthocarboxylic acid, the above step of forming a coating film can be carried out without being influenced by humidity (content of water vapor in the atmosphere). For example, when the above step is carried out at an ambient humidity of more than 5 g/m$^3$, a high-quality tantalum oxide film can be obtained and when the above step is carried out at an ambient humidity of 7 g/m$^3$ or more, particularly 9 g/m$^3$ or more, a high-quality tantalum oxide film can be obtained.

The thus formed coating film is then converted into a tantalum oxide film by a heat and/or optical treatment.

The heat treatment temperature is preferably 200° C. or more, more preferably 300 to 900° C., much more preferably 350 to 800° C. Although the heating time may be suitably determined according to the thickness of a coating film, in order to obtain a high-quality film, it is preferably 5 minutes or more, more preferably 15 to 90 minutes, much more preferably 30 to 60 minutes.

As for the atmosphere for the heating step, a higher content of oxygen is more preferred.

As the atmosphere for the above heat treatment may be used, for example, air, pure oxygen, ozone, $N_2O$, a mixture thereof, or a mixed gas of an oxidized gas thereof and an inert gas such as nitrogen, helium or argon.

The light source used for the above photo-treatment is a low-pressure or high-pressure mercury lamp, deuterium lamp, discharge light of a rare gas such as argon, krypton or xenon, YAG laser, argon laser, carbonic acid gas laser or exima laser such as XeF, XeCl, XeBr, KrF, KrCl, ArF or ArCl. The output of the above light source is preferably 10 to 5,000 W, more preferably 100 to 1,000 W. The irradiation time is preferably 0.1 to 60 minutes, more preferably 1 to 30 minutes. The wavelength of the light source is not particularly limited but preferably includes a wavelength of 170 to 600 nm.

The atmosphere for the optical treatment may be the same as that for the above heat treatment. The temperature of the photo-treatment is not particularly limited but generally room temperature to 500° C. The coating film may be exposed through a mask so that only a specific portion can be exposed.

To obtain a higher quality tantalum oxide film, it is preferred that the above heat treatment and optical treatment should be both carried out. The order of these treatments may be arbitrary and both may be carried out at the same time. The obtained tantalum film can be made amorphous or crystalline according to the conditions of the heat treatment and/or optical treatment.

Optionally, the tantalum oxide film formed as described above may be further subjected to an oxygen plasma or UV-ozone treatment before use.

The thus obtained tantalum oxide film has a dielectric constant of 15 to 25 in an amorphous state and 25 to 60 in a crystalline state and a small leak current and can be advantageously used as a high dielectric film such as an insulating film for semiconductor devices, for example, a capacitor insulating film or gate insulating film for use in DRAMs, as well as anti-reflection film, passivation film or barrier film.

The tantalum oxide film for use as an insulating film for semiconductor devices has a leak current of preferably $10^{-2}$ A/cm$^2$ or less, more preferably $10^{-4}$ A/cm$^2$ or less.

EXAMPLES

The following examples are provided for the purpose of further illustrating the present invention but are in no way to be taken as limiting.

Synthetic Example 1

A mixed solution of 10 g of triethanolamine and 67 ml of tetrahydrofuran (THF) was added to a solution of 8.1 g of tantalum pentaethoxide dissolved in 67 ml of THF in a nitrogen atmosphere under agitation at room temperature in 15 minutes. After the end of addition, they were further stirred at room temperature for 1 hour. The reaction solution turned slightly cloudy from achromatic and transparent. Thereafter, it was concentrated under reduced pressure and the residue was washed with hexane, re-dissolved in a small amount of tetrahydrofuran and re-precipitated with hexane. The obtained white solid was separated by filtration and dried under reduced pressure. When it was analyzed by $^1$H-NMR, a peak derived from tantalum pentaethoxide disappeared and a peak derived from triethanolamine appeared. The yield was 80%. The reaction conversion of the ethoxyl groups of the raw material tantalum pentaethoxide was 100 mol %. When the number average molecular weight of the reaction product was measured by GPC analysis, it was 1,500.

The GPC measurement was made under the following conditions (the same shall apply to Synthetic Examples 2 to 5, 7, 8 and 10).

Solvent: tetrahydrofuran (THF)
Concentration: 0.1 g of a tantalum compound dissolved in 10 ml of THF
Standard sample: standard polystyrene of Pressure Chemical Co., Ltd.
Apparatus: high-temperature high-speed gel permeation chromatograph (Model 1500-C ALC/GPC of Waters Co., Ltd.)
Column: SHODEX A-80M of Showa Denko K. K. (length of 50 cm)
Measurement temperature: 40° C.
Flow rate: 1 ml/min FIG. 1 shows an NMR chart of the product.

Synthetic Example 2

8.12 (20 mmol) of tantalum pentaethoxide and 50 ml of tetrahydrofuran (THF) were fed to a 200 ml eggplant-like flask the inside of which had been fully substituted by nitrogen in a nitrogen atmosphere and 8.1 g (76 mmol) of diethylene glycol was added to the flask under agitation at room temperature in 15 minutes. Thereafter, they were further stirred at room temperature for 1 hour.

The reaction solution remained achromatic and transparent but its viscosity slightly increased.

Thereafter, the solvent was completely removed under reduced pressure to obtain 7.8 g of a white solid (tantalum-containing product).

When it was analyzed by $^1$H-NMR, a peak derived from an unreacted ethoxyl group of tantalum pentaethoxide and a peak derived from a reaction product of tantalum pentaethoxide and diethylene glycol were observed and the integral ratio thereof was 1:20. When the reaction conversion of the ethoxyl groups of tantalum pentaethoxide was calculated from this ratio, it was 91 mol %.

When the number average molecular weight of the product was measured by GPC analysis, it was 730. When the content of tantalum was calculated by elemental analysis, it was 40.9 wt %.

Figure 2:
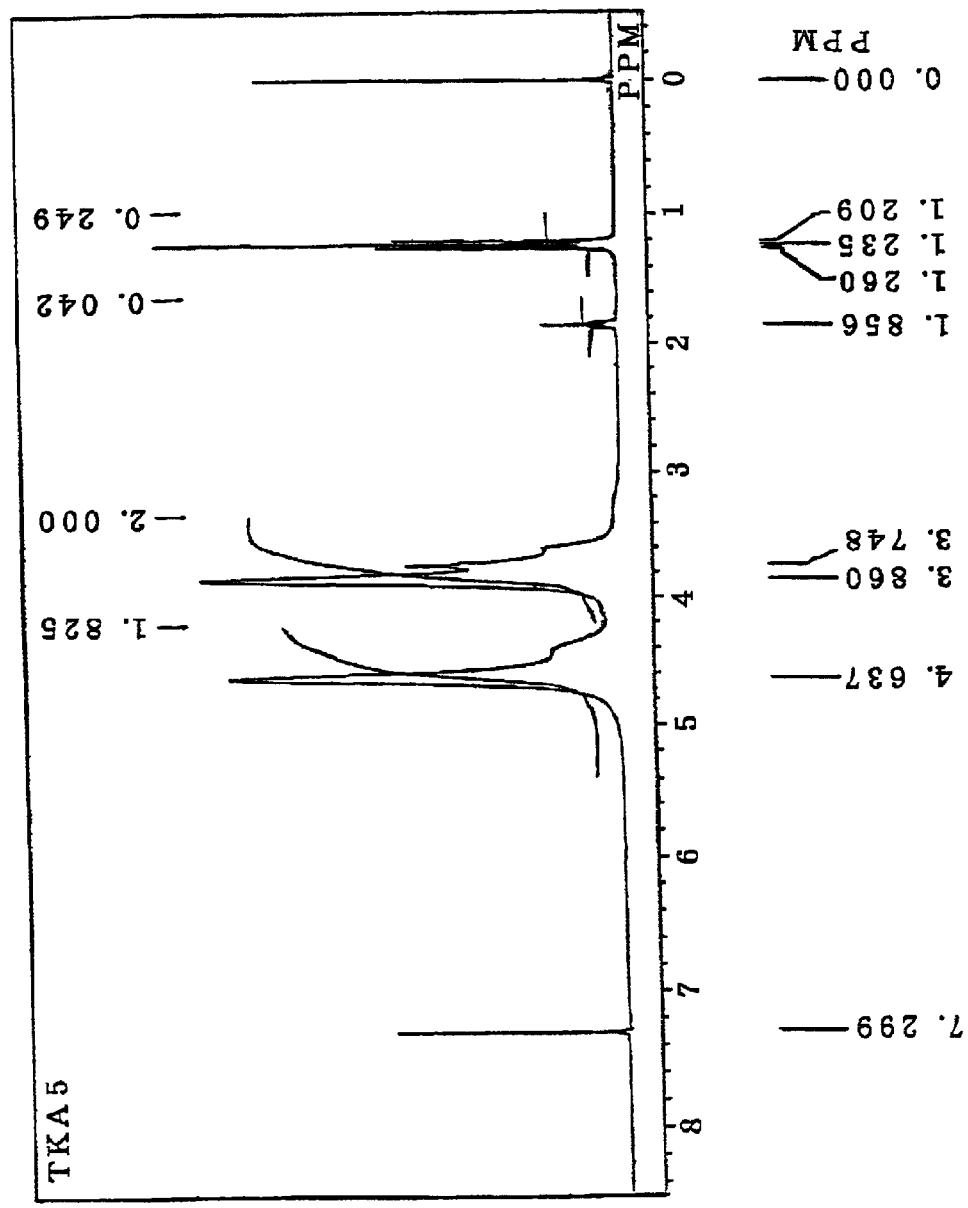
FIG. 2 is an $^1$H-NMR spectrum diagram of a tantalum-containing product obtained in Synthetic Example 2.

FIG. 2 shows a $^1$H-NMR chart of the product.

Synthetic Example 3

The procedure of Synthetic Example 2 was repeated to produce 12.5 g of a white solid (tantalum-containing product) except that the amount of diethylene glycol was changed to 16.2 g (584 mmol).

When the obtained solid was analyzed by $^1$H-NMR, a peak derived from an unreacted ethoxyl group of tantalum pentaethoxide and a peak derived from a reaction product of tantalum pentaethoxide and diethylene glycol were observed, and the integral ratio thereof was 1:36. When the reaction conversion of the ethoxyl groups of tantalum pentaethoxide was calculated from this ratio, it was 93 mol %.

When the number average molecular weight of the product was measured by GPC analysis, it was 680. When the content of tantalum was calculated by elemental analysis, it was 25.5 wt %.

Synthetic Example 4

The procedure of Synthesis Example 2 was repeated to produce 4.2 g of a white solid (tantalum-containing product) except that 2.9 g (50 mmol) of ethylene glycol was used in place of 8.1 g of diethylene glycol. When the obtained solid was analyzed by $^1$H-NMR, a peak derived from an unreacted ethoxyl group of tantalum pentaethoxide and a peak derived from a reaction product of tantalum pentaethoxide and ethylene glycol were observed, and the integral ratio thereof was 1:14. When the reaction conversion of the ethoxyl groups of tantalum pentaethoxide was calculated from this ratio, it was 91 mol %.

When the product was measured by GPC analysis, its molecular weight distribution was multi-modal and showed a peak at 500 to 1,540. When the number average molecular weight of the product was calculated, it was 540. When the content of tantalum was calculated by elemental analysis, it was 54.2 wt %.

Synthetic Example 5

The procedure of Synthetic Example 2 was repeated to produce 8.8 g of a white solid (tantalum-containing product) except that 5.8 g (10 mmol) of ethylene glycol was used in place of 8.1 g of diethylene glycol. When the obtained solid was analyzed by $^1$H-NMR, a peak derived from an unreacted ethoxyl group of tantalum pentaethoxide and a peak derived from a reaction product of tantalum pentaethoxide and ethylene glycol were observed, and the integral ratio thereof was 1:30. When the reaction conversion of the ethoxyl groups of tantalum pentaethoxide was calculated from this ratio, it was 96 mol %.

When the product was measured by GPC analysis, its molecular weight distribution was multi-modal and showed a peak at 500 to 1,200. When the number average molecular weight of the product was calculated, it was 740. When the content of tantalum was calculated by elemental analysis, it was 39.2 wt %.

Synthetic Example 6

8.12 g (20 mmol) of tantalum pentaethoxide and 50 ml of tetrahydrofuran (THF) were fed to a 200 ml eggplant-like flask the inside of which had been fully substituted by nitrogen in a nitrogen atmosphere, and 5.5 g (50 mmol) of hydroquinone was added to the flask under agitation at room temperature in 15 minutes.

A white solid separated out and became cloudy as soon as addition of hydroquinone was started.

Thereafter, they were further stirred at room temperature for 1 hour.

After the end of the reaction, the formed solid was isolated by filtration, and the solvent was completely removed under reduced pressure to obtain 8.6 g of a white solid (tantalum-containing product).

When the obtained white solid was analyzed by $^1$H-NMR, a peak derived from an unreacted ethoxyl group of tantalum pentaethoxide and a peak derived from a reaction product of tantalum pentaethoxide and hydroquinone were observed, and the integral ratio thereof was 1:21. When the reaction conversion of the ethoxyl groups of tantalum pentaethoxide was calculated from this ratio, it was 94 mol %. When the content of tantalum was calculated by elemental analysis, it was 39.8 wt %.

Synthetic Example 7

15 g (37 mmol) of tantalum pentaethoxide and 150 ml of tetrahydrofuran (THF) were fed to a 300 ml eggplant-like flask the inside of which had been fully substituted by nitrogen in a nitrogen atmosphere and cooled to 0° C., and a solution of 9.8 g (92 mmol) of diethylene glycol dissolved in 75 ml of THF was added to the flask under agitation at room temperature in 1.5 hours. Thereafter, they were further stirred at 0° C. for 8 hours. The reaction solution remained achromatic and transparent but its viscosity slightly increased.

The solvent was then completely removed under reduced pressure, and the residue was washed with 25 ml of hexane and vacuum dried to obtain 13 g of a white solid.

When the obtained white solid was analyzed by $^1$H-NMR, a peak derived from an unreacted ethoxyl group of tantalum pentaethoxide and a peak derived from a reaction product of tantalum pentaethoxide and diethylene glycol were observed, and the integral ratio thereof was 1:16. When the reaction conversion of the ethoxyl groups of tantalum pentaethoxide was calculated from this ratio, it was 86 mol %. When the number average molecular weight of the product was measured by GPC analysis, it was 930.

Figure 3:
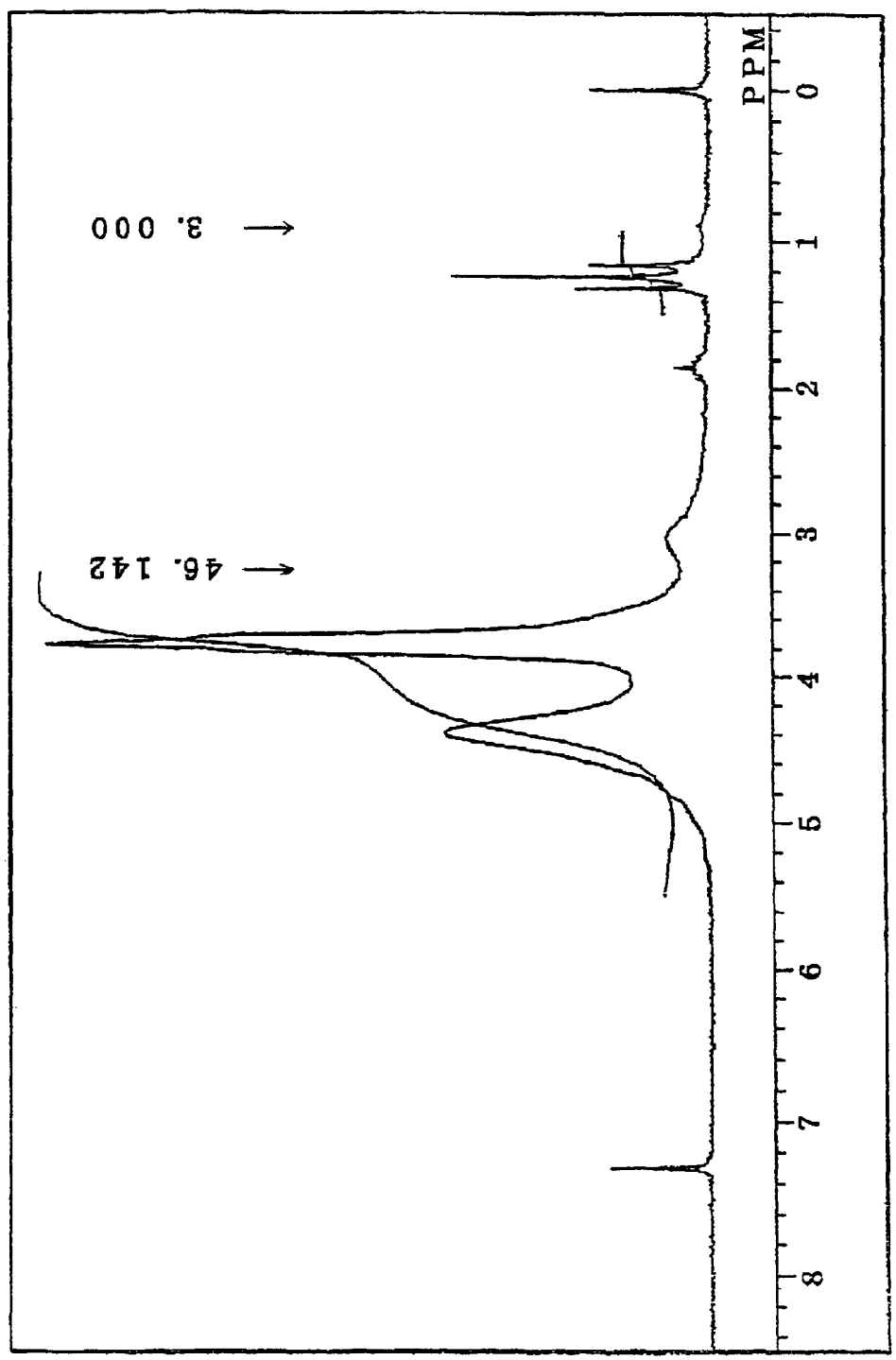
FIG. 3 is an $^1$H-NMR spectrum diagram of a product obtained in Synthetic Example 7.

FIG. 3 shows an $^1$H-NMR chart of the product.

Synthetic Example 8

A mixed solution of 10 g of triethanolamine and 67 ml of tetrahydrofuran (THF) was added to a solution of 8.1 g of tantalum pentaisopropoxide dissolved in 67 ml of THF in a nitrogen atmosphere under agitation at room temperature in 15 minutes. After the end of addition, they were further stirred at room temperature for 1 hour. The reaction solution turned slightly cloudy from achromatic and transparent. Thereafter, it was concentrated under reduced pressure and the residue was washed with hexane, re-dissolved in a small amount of tetrahydrofuran and re-precipitated with hexane. The obtained precipitate was separated by filtration and dried under reduced pressure. When the product was analyzed by $^1$H-NMR, a peak derived from an isopropoxyl group of tantalum pentaisopropoxide disappeared and a peak derived from triethanolamine appeared. The yield was 85%. The reaction conversion of the isopropoxyl groups of the raw material tantalum pentaisopropoxide was 100 mol %. When the number average molecular weight of the product was measured by GPC analysis, it was 1,800.

Synthetic Example 9

11 g (20 mmol) of tantalum pentabutoxide and 50 ml of tetrahydrofuran (THF) were fed to a 200 ml eggplant-like flask the inside of which had been fully substituted by nitrogen in a nitrogen atmosphere and 5.5 g (50 mmol) of hydroquinone was added to the flask under agitation at room temperature in 15 minutes.

A white solid separated out and became cloudy as soon as addition of hydroquinone was started.

Thereafter, they were stirred at room temperature for 1 hour.

After the end of the reaction, the formed solid was isolated by filtration, and the solvent was completely removed under reduced pressure to obtain 12 g of a product.

When the obtained product was analyzed by $^1$H-NMR, a peak derived from an unreacted butoxyl group of tantalum pentabutoxide and a peak derived from a reaction product of tantalum pentabutoxide and hydroquinone were observed, and the integral ratio thereof was 1:21. When the reaction conversion of the butoxyl groups of tantalum pentabutoxide was calculated from this ratio, it was 94 mol %.

Synthetic Example 10

8.12 g (20 mmol) of tantalum pentaethoxide and 50 ml of tetrahydrofuran (THF) were fed to a 200 ml eggplant-like flask the inside of which had been fully substituted by nitrogen in a nitrogen atmosphere and 5.3 g (50 mmol) of diethylene glycol was added to the flask under agitation at room temperature in 15 minutes. Thereafter, they were further stirred at room temperature for 1 hour. The reaction solution remained achromatic and transparent but its viscosity slightly increased.

Thereafter, the solvent was completely removed under reduced pressure to obtain 7.8 g of a white solid.

When the obtained white solid was analyzed by $^1$H-NMR, a peak derived from an unreacted ethoxyl group of tantalum pentaethoxide and a peak derived from a reaction product of tantalum pentaethoxide and diethylene glycol were observed, and the integral ratio thereof was 1:20. When the reaction conversion of the ethoxyl groups of tantalum pentaethoxide was calculated from this ratio, it was 88 mol %. When the number average molecular weight of the product was measured by GPC analysis, it was 870.

FIG. 4 shows an $^1$H-NMR chart of the product.

Synthetic Example 11

The procedure of Synthesis Example 6 was repeated to produce 5.3 g of a white solid except that the amount of hydroquinone was changed to 3.3 g (30 mmol).

When the obtained solid was analyzed by $^1$H-NMR, a peak derived from an untreated ethoxyl group of tantalum pentaethoxide and a peak derived from a reaction product of tantalum pentaethoxide and hydroquinone were observed, and the integral ratio thereof was 1:2.4. When the reaction conversion of the ethoxyl groups of pentaethoxide was calculated from this ratio, it was 64 mol %.

Example 1

Figure 5:
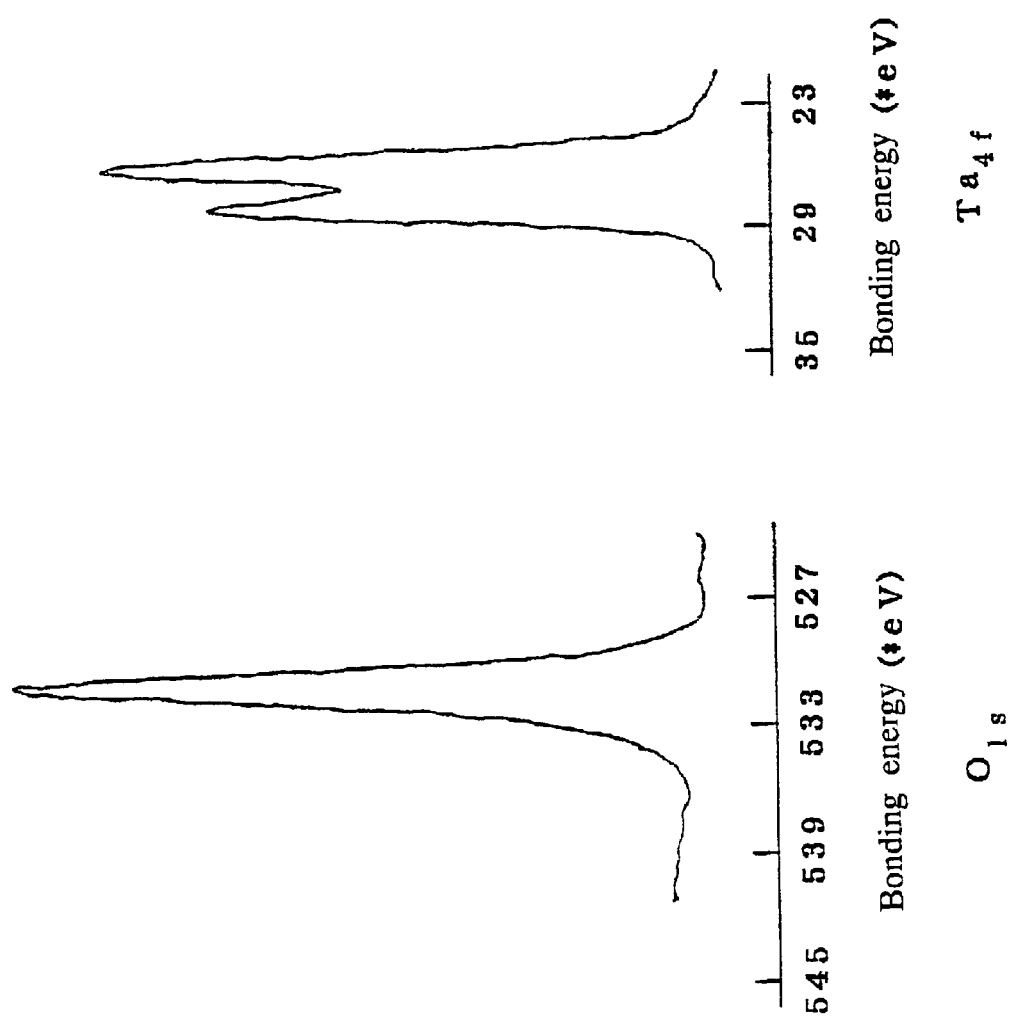
FIG. 5 is an ESCA spectrum diagram of a $Ta_2O_5$ film obtained in Example 1.

1 g of the tantalum-containing product (tantalum compound) obtained in the above Synthetic Example 1 was dissolved in 10 ml of a mixed solution of diethylene glycol monoethyl ether and water (volume ratio of 90/10) to prepare a solution. This solution was filtered with a Teflon (registered trademark) filter having an opening size of 0.2 $\mu$m to remove foreign matter and then applied to a silicon substrate by spin coating at 2,000 rpm. When the coating film was heated at 500° C. for 30 minutes in the presence of air after the solvent was evaporated in the air, a transparent film was obtained on the substrate. The thickness of this film was 800 Å. When the ESCA spectrum of this film was measured, a peak derived from the $Ta_{4f7/2}$ orbit was observed at 26 eV and a peak derived from the $O_{1s}$ orbit was observed at 531 eV, which proved that this film was a $Ta_2O_5$ film. This ESCA spectrum is shown in FIG. 5.

Example 2

A film was formed in the same manner as in Example 1 except that 20 ml of a mixed solution of diethylene glycol monoethyl ether, water and 2-propoxyethanol (volume ratio of 80/5/15) was used as a solvent in place of the mixed solution of diethylene glycol monoethyl ether and water (volume ratio of 90/10). The thickness of this film was 350 nm. When the ESCA spectrum of this film was measured, a peak derived from the $Ta_{4f7/2}$ orbit was observed at 26 eV and a peak derived from the $O_{1s}$ orbit was observed at 531 eV in the same way as Example 1, which proved that this film was a $Ta_2O_5$ film.

Example 3

A film was formed in the same manner as in Example 1 except that 10 ml of a mixed solution of diethylene glycol monoethyl ether and 2-propoxyethanol (volume ratio of 50/50) was used as a solvent in place of the mixed solution of diethylene glycol monoethyl ether and water (volume ratio of 90/10). The thickness of this film was 800 nm. When the ESCA spectrum of this film was measured, a peak derived from the $Ta_{4f7/2}$ orbit was observed at 26 eV and a peak derived from the $O_{1s}$ orbit was observed at 531 eV in the same way as Example 1, which proved that this film was a $Ta_2O_5$ film.

Example 4

1 g of the tantalum-containing product obtained in Synthetic Example 2 was dissolved in 9 g of diethylene glycol monomethyl ether and the resulting solution was filtered with a Teflon filter having an opening size of 0.2 $\mu$m to prepare a composition for forming a tantalum oxide film.

Figure 6:
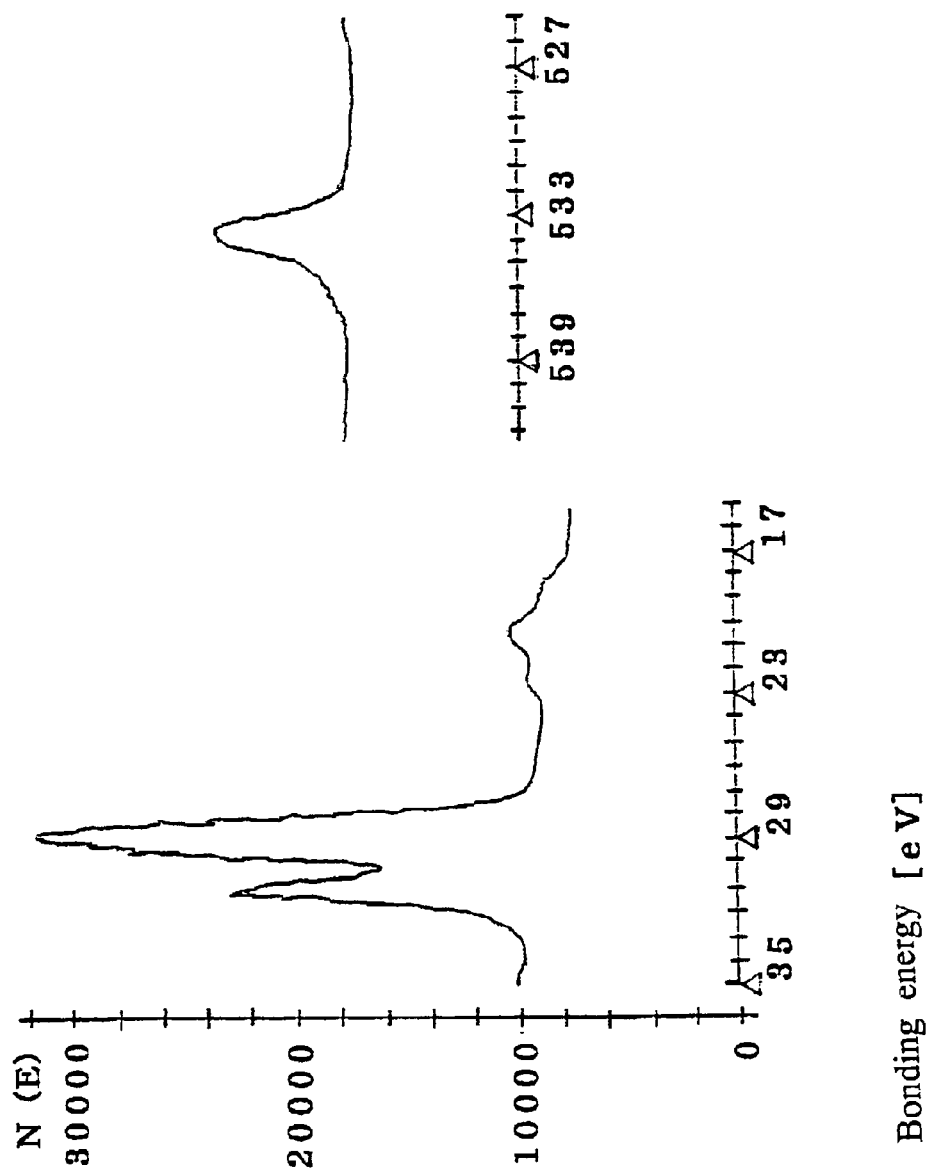
FIG. 6 is an ESCA spectrum diagram of a tantalum oxide film obtained in Example 4.

This composition was applied to a silicon substrate having a 0.2 $\mu$m-thick platinum coating film to a thickness of 0.091 $\mu$m by spin coating at 2,000 rpm at an ambient humidity of 2 g/m$^3$. Thereafter, when the coating film was heated at 500° C. for 30 minutes in the presence of air after the solvent was evaporated in the air, a transparent film was obtained on the substrate. The thickness of this film was 0.030 $\mu$m. When the ESCA spectrum of this film was measured, a peak derived from the $Ta_{4f7/2}$ orbit was observed at 26 eV and a peak derived from the $O_{1s}$ orbit was observed at 531 eV, which proved that this film was a tantalum oxide film. This ESCA spectrum is shown in FIG. 6. When platinum was sputtered on this film to a thickness of 0.060 μm and a voltage of 1.5 V was applied to this film, the leak current was $10^{-8}$ A/cm² which was satisfactory as an insulating film for semiconductor devices.

Example 5

A transparent film was obtained in the same manner as in Example 4 except that 1 g of the tantalum-containing product obtained in Synthetic Example 3 was used. The thickness of this film was 0.035 μm. When the ESCA spectrum of this film was measured, this film was found to be a tantalum oxide film. The leak current of the obtained film was $10^{-8}$ A/cm² which was satisfactory as an insulating film for semiconductor devices.

Example 6

A transparent film was obtained in the same manner as in Example 4 except that 1 g of the tantalum-containing product obtained in Synthetic Example 4 was used. The thickness of this film was 0.032 μm. When the ESCA spectrum of this film was measured, this film was found to be a tantalum oxide film. The leak current of the obtained film was $10^{-8}$ A/cm² which was satisfactory as an insulating film for semiconductor devices.

Example 7

A transparent film was obtained in the same manner as in Example 4 except that 1 g of the tantalum-containing product obtained in Synthetic Example 5 was used. The thickness of this film was 0.032 μm. When the ESCA spectrum of this film was measured, this film was found to be a tantalum oxide film. The leak current of the obtained film was $10^{-8}$ A/cm² which was satisfactory as an insulating film for semiconductor devices.

Example 8

A transparent film was obtained in the same manner as in Example 4 except that 1 g of the tantalum-containing product obtained in Synthetic Example 6 was used. The thickness of this film was 0.031 μm. When the ESCA spectrum of this film was measured, this film was found to be a tantalum oxide film. The leak current of the obtained film was $10^{-8}$ A/cm² which was satisfactory as an insulating film for semiconductor devices.

Example 9

A composition for forming a tantalum oxide film was prepared by dissolving 1.0 g of the product obtained in Synthetic Example 7 and 0.9 g of methyl orthoformate in 8.1 g of 1-methoxy-2-propanol and filtering the resulting solution with a Teflon (registered trademark) filter having an opening size of 0.2 μm.

This composition was then applied to a silicon substrate having a 200 nm-thick platinum coating film to a thickness of 100 nm by spin coating at 2,000 rpm at an ambient humidity of 7 g/m³ and then the solvent was evaporated at 145° C. The thickness of the film after the removal of the solvent was 65 nm.

Figure 7:
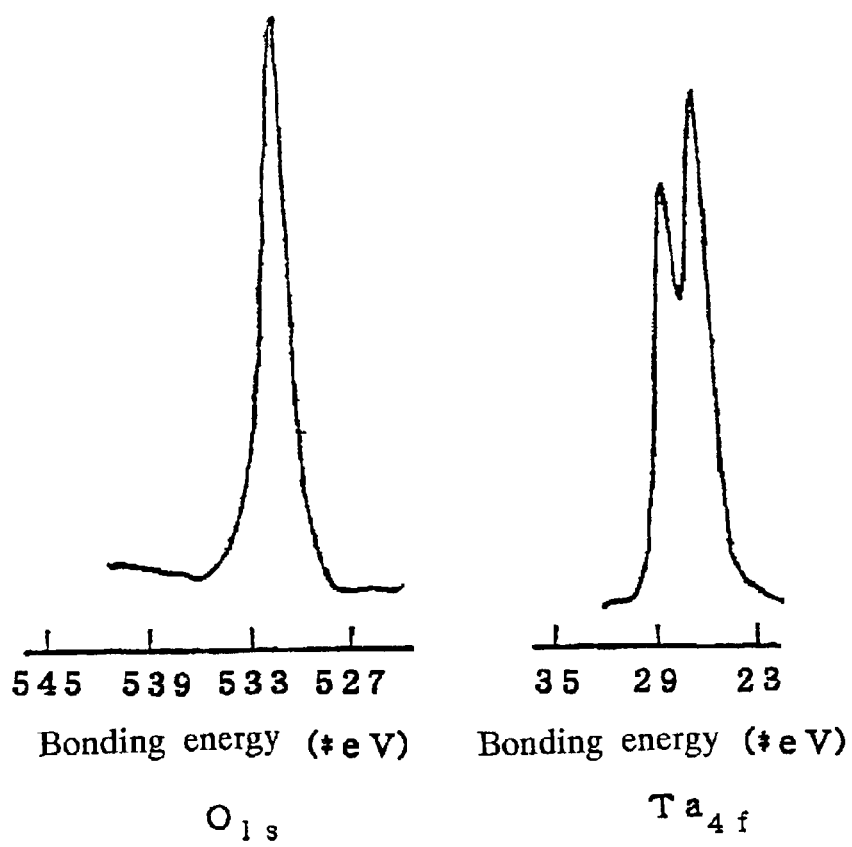
FIG. 7 is an ESCA spectrum diagram of a tantalum oxide film obtained in Example 9.

Thereafter, when the film was heated at 400° C. in the air for 30 minutes, a transparent film was obtained on the substrate. The thickness of this film was 40 nm. When the ESCA spectrum of this film was measured, a peak derived from the $Ta_{4f7/2}$ orbit was observed at 26 eV and a peak derived from the $O_{1s}$ orbit was observed at 531 eV, which proved that this film was a tantalum oxide film. This ESCA spectrum is shown in FIG. 7. When an aluminum film was formed on this film to a thickness of 100 nm by deposition and then a voltage of 1.5 V was applied, the leak current was $10^{-8}$ A/cm² which was satisfactory as an insulating film for semiconductor devices.

Example 10

A composition for forming a tantalum oxide film was prepared by dissolving 1.0 g of the product obtained in Synthetic Example 7 and 0.9 g of methyl orthoformate in 8.1 g of 1-methoxy-2-propanol and filtering the resulting solution with a Teflon (registered trademark) filter having an opening size of 0.2 μm.

This composition was then applied to a silicon substrate having a 200 nm-thick platinum coating film to a thickness of 100 nm by spin coating at 2,000 rpm at an ambient humidity of 9 g/m³ and then the solvent was evaporated at 145° C. The thickness of the film after the removal of the solvent was 63 nm.

Thereafter, when the film was heated at 400° C. in the air for 30 minutes, a transparent film was obtained on the substrate. The thickness of this film was 40 nm. The same procedure was repeated twice to form three coating layers in order to obtain a laminated film. The total thickness of this laminated film was 110 nm. When the ESCA spectrum of this film was measured, this film was found to be a tantalum oxide film. The leak current of the obtained film was $10^{-8}$ A/cm² which was satisfactory as an insulating film for semiconductor devices.

Example 11

A composition for forming a tantalum oxide film was prepared by dissolving 1.0 g of the product obtained in Synthetic Example 7 and 0.9 g of methyl orthoformate in 8.1 g of propylene glycol monopropyl ether (isomer mixture) and filtering the resulting solution with a Teflon (registered trademark) filter having an opening size of 0.2 μm.

This composition was then applied to a silicon substrate having a 200 nm-thick platinum coating film to a thickness of 100 nm by spin coating at 2,000 rpm at an ambient humidity of 7 g/m³ and then the solvent was evaporated at 145° C. The thickness of the film after the removal of the solvent was 60 nm.

Thereafter, when the film was exposed to light having a wavelength of 254 nm at an exposure amount of 50,000 J/m² in an oxygen atmosphere and then heated at 400° C. in the air for 30 minutes, a transparent film was obtained on the substrate. The thickness of this film was 35 nm. When the ESCA spectrum of this film was measured, this film was found to be a tantalum oxide film. The leak current of the obtained film was $10^{-8}$ A/cm² which was satisfactory as an insulating film for semiconductor devices.

Example 12

A transparent film was obtained in the same manner as in Example 9 except that 1.0 g of the product obtained in Synthetic Example 8 and 0.9 g of ethyl orthoformate were dissolved in 8.1 g of diethylene glycol. The thickness of this film was 42 nm. When the ESCA spectrum of this film was measured, the film was found to be a tantalum oxide film. The leak current of the obtained film was $10^{-8}$ A/cm² which was satisfactory as an insulating film for semiconductor devices.

Example 13

A transparent film was obtained in the same manner as in Example 9 except that 1.0 g of the product obtained in Synthetic Example 9 and 0.9 g of methyl orthobenzoate were dissolved in 8.1 g of butanol. The thickness of this film was 31 nm. When the ESCA spectrum of this film was measured, the film was found to be a tantalum oxide film. The leak current of the obtained film was $10^{-8}$ A/cm$^2$ which was satisfactory as an insulating film for semiconductor devices.

Example 14

A composition for forming a tantalum oxide film was prepared by dissolving 1.0 g of the white solid obtained in Synthetic Example 10 in 9 g of propylene glycol monomethyl ether (isomer mixture) and filtering the resulting solution with a Teflon (registered trademark) filter having an opening size of 0.2 μm.

Figure 8:
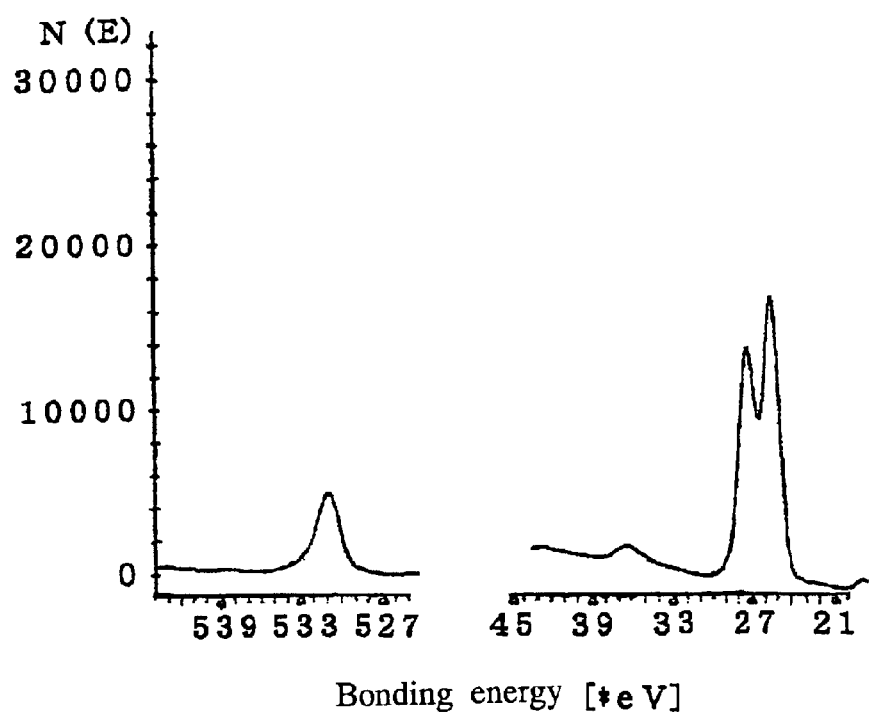
FIG. 8 is an ESCA spectrum diagram of a tantalum oxide film obtained in Example 14.

This composition was then applied to a silicon substrate having a 0.2 μm-thick platinum coating film by spin coating at 2,000 rpm at an ambient humidity of 3 g/m$^3$ in the air and then the solvent was evaporated on a hot plate heated at 145° C. at an ambient humidity of 3 g/m$^3$. The thickness of the film after the removal of the solvent was 0.050 μm. Thereafter, when the film was heated at 400° C. in the air for 30 minutes, a transparent film was obtained on the substrate. The thickness of this film was 0.030 μm. When the ESCA spectrum of this film was measured, a peak derived from the $Ta_{4f7/2}$ orbit was observed at 26 eV and a peak derived from the $O_{1s}$ orbit was observed at 531 eV, which proved that this film was a tantalum oxide film. This ESCA spectrum is shown in FIG. 8. After a platinum film was formed on this film to a thickness of 0.060 μm by sputtering, the leak current at a field strength of 1.5 V/cm$^{-1}$ was $10^{-8}$ A/cm$^2$ which was satisfactory as an insulating film for semiconductor devices.

Example 15

A composition for forming a tantalum oxide film was prepared by dissolving 1.0 g of the white solid obtained in Synthetic Example 10 in 9 g of propylene glycol monomethyl ether (isomer mixture) and filtering the resulting solution with a Teflon (registered trademark) filter having an opening size of 0.2 μm.

This composition was then applied to a silicon substrate having a 0.2 μm-thick platinum coating film by spin coating at 2,000 rpm at an ambient humidity of 3 g/m$^3$ and then the solvent was evaporated on a hot plate heated at 145° C. at an ambient humidity of 3 g/m$^3$ in the air. The thickness of the film after the removal of the solvent was 0.048 μm. Thereafter, when the film was exposed to light having a wavelength of 254 nm at an exposure amount of 5 J/cm$^2$ in an oxygen atmosphere and then heated at 400° C. in the air for 30 minutes, a transparent film was obtained on the substrate. The thickness of this film was 0.027 μm. When the ESCA spectrum of this film was measured, this film was found to be a tantalum oxide film. After a platinum film was formed on this film to a thickness of 0.060 μm by sputtering, the leak current at a field strength of 1.5 V/cm$^{-1}$ was $10^{-9}$ A/cm$^2$ which was satisfactory as an insulating film for semiconductor devices.

Example 16

A composition for forming a tantalum oxide film was prepared by dissolving 1 g of the white solid obtained in Synthetic Example 6 in 9 g of propylene glycol monomethyl ether (isomer mixture) and filtering the resulting solution with a Teflon (registered trademark) filter having an opening size of 0.2 μm.

This composition was then applied to a silicon substrate having a 0.2 μm-thick platinum coating film to a thickness of 0.090 μm by spin coating at 2,000 rpm at an ambient humidity of 3 g/m$^3$. Thereafter, when the film was exposed to light having a wavelength of 254 nm at an exposure amount of 5 J/cm$^2$ in an oxygen atmosphere and then heated at 400° C. in the air for 30 minutes, a transparent film was obtained on the substrate. The thickness of this film was 0.027 μm. When the ESCA spectrum of this film was measured, the film was found to be a tantalum oxide film. After a platinum film was formed on this film to a thickness of 0.060 μm by sputtering, the leak current at a field strength of 1.5 V/cm$^{-1}$ was $10^{-9}$ A/cm$^2$ which was satisfactory as an insulating film for semiconductor devices.

Example 17

A composition for forming a tantalum oxide film was prepared by dissolving 1 g of the white solid obtained in Synthetic Example 10 in 9 g of propylene glycol monomethyl ether and filtering the resulting solution with a Teflon (registered trademark) filter having an opening size of 0.2 μm.

This composition was then applied to a silicon substrate having a 0.2 μm-thick platinum coating film by spin coating at 2,000 rpm at an ambient humidity of 3 g/m$^3$ and then the solvent was evaporated on a hot plate heated at 145° C. at an ambient humidity of 3 g/m$^3$ in the air. The thickness of the film after the removal of the solvent was 0.052 μm.

Thereafter, when the film was heated at 400° C. in the air for 30 minutes, a transparent film was obtained on the substrate. The thickness of this film was 0.030 μm. Further, a film was formed on this film by spin coating at 2,000 rpm at an ambient humidity of 5 g/m$^3$, the solvent was evaporated on a hot plate heated at 145° C. and the film was heated at 400° C. in the presence of air for 30 minutes to obtain a laminated film. The total thickness of this laminated film was 0.070 μm. When the ESCA spectrum of this film was measured, the film was found to be a tantalum oxide film. After a platinum film was formed on this film to a thickness of 0.060 μm by sputtering, the leak current at a field strength of 1.5 V/cm$^{-1}$ was $10^{-9}$ A/cm$^2$ which was satisfactory as an insulating film for semiconductor devices.

Example 18

A composition for forming a tantalum oxide film was prepared by dissolving 1 g of the white solid obtained in Synthetic Example 10 in 9 g of propylene glycol monomethyl ether (isomer mixture) and filtering the resulting solution with a Teflon (registered trademark) filter having an opening size of 0.2 μm. This composition was then applied to a silicon substrate having a 0.2 μm-thick platinum coating film by spin coating at 2,000 rpm at an ambient humidity of 1 g/m$^3$ and then the solvent was evaporated on a hot plate heated at 145° C. at an ambient humidity of 1 g/m$^3$ in the air. The thickness of the film after the removal of the solvent was 0.048 μm.

Thereafter, when the film was heated at 400° C. in the air for 30 minutes, a transparent film was obtained on the substrate. The thickness of this film was 0.035 μm. When the ESCA spectrum of this film was measured, the film was found to be a tantalum oxide film. The leak current of the obtained film was $10^{-9}$ A/cm$^2$ which was satisfactory as an insulating film for semiconductor devices.

Example 19

A composition for forming a tantalum oxide film was prepared by dissolving 1 g of the white solid obtained in Synthetic Example 11 in 9 g of propylene glycol monomethyl ether (isomer mixture) and filtering the resulting solution with a Teflon (registered trademark) filter having an opening size of 0.2 μm.

This composition was then applied to a silicon substrate having a 0.2 μm-thick platinum coating film by spin coating at 2,000 rpm at an ambient humidity of 3 g/m$^3$ and then the solvent was evaporated on a hot plate heated at 145° C. at an ambient humidity of 3 g/m$^3$ in the air. The thickness of the film after the removal of the solvent was 0.051 μm.

Thereafter, when the film was heated at 400° C. in the air for 30 minutes, a transparent film was obtained on the substrate. The thickness of this film was 0.030 μm. When the ESCA spectrum of this film was measured, the film was found to be a tantalum oxide film. After a 0.060 μm-thick platinum film was formed on this film by sputtering, the leak current at a field strength of 1.5 V/cm$^{-1}$ was 10$^{-5}$ A/cm$^2$ which proved that the film could be used as an insulating film for semiconductor devices.

What is claimed is:

1. A composition for forming a tantalum oxide film, consisting essentially of at least one tantalum-containing product selected from the group consisting of (A1) a reaction product of (a1) a tantalum alkoxide and (a2) at least one compound selected from the group consisting of an amino alcohol having no more than one hydroxyl group, a compound having two or more hydroxyl groups in the molecule, a β-diketone, a β-ketoester, an ester of β-dicarboxylic acid, lactic acid, ethyl lactate and 1,5-cyclooctadiene, and (A2) a hydrolyzate of the reaction product.

2. The composition of claim 1, wherein the tantalum alkoxide (a1) is represented by the following formula (1):

$$Ta(OR)_5 \quad (1)$$

wherein R is an alkyl group having 1 to 6 carbon atoms and may be the same or different.

3. The composition of claim 1, wherein the tantalum-containing product is a reaction product of the component (a1) and the component (a2).

4. The composition of claim 1, wherein the reaction conversion of the alkoxyl groups of the component (a1) in the reaction product of the component (a1) and the component (a2) is 50 mol % or more.

5. The composition of claim 1, wherein the number average molecular weight of the reaction product of the component (a1) and the component (a2) is 300 to 10,000.

6. The composition of claim 1, wherein the component (a2) is a compound having two or more hydroxyl groups in the molecule.

7. The composition of claim 1 which further comprises (B) an ester of orthocarboxylic acid.

8. A process for forming a tantalum oxide film, comprising
applying the composition of claim 1 to a substrate and subjecting it to at least one of a heat treatment and a photo-treatment to form a tantalum oxide film.

9. The process of claim 8, wherein the application is carried out at an ambient humidity of 0.5 g/m$^3$ or less.

10. A tantalum oxide film formed by the process of claim 8.

11. An insulating film for semiconductor devices which is the tantalum oxide film of claim 10.

12. The composition of claim 2, wherein the component (a2) is a compound having two or more hydroxyl groups in the molecule.

13. The composition of claim 3, wherein the component (a2) is a compound having two or more hydroxyl groups in the molecule.

14. The composition of claim 4, wherein the component (a2) is a compound having two or more hydroxyl groups in the molecule.

15. The composition of claim 5, wherein the component (a2) is a compound having two or more hydroxyl groups in the molecule.

16. A composition comprising at least one tantalum-containing compound selected from the group consisting of (A1) a reaction product of (a1) a tantalum alkoxide and (a2) at least one compound selected from the group consisting of an amino alcohol having no more than one hydroxyl group, a compound having two or more hydroxyl groups in the molecule, a β-diketone, a β-ketoester, an ester of β-dicarboxylic acid, lactic acid, ethyl lactate and 1,5-cyclooctadiene, (A2) a hydrolyzate of the reaction product of (a1) and (a2); and (B) an ester of an orthocarboxylic acid.

17. The composition of claim 16, wherein the tantalum alkoxide (a1) is represented by formula (1):

$$Ta(OR)_5 \quad (1)$$

wherein R is an alkyl group having 1 to 6 carbon atoms and may be the same or different.

18. The composition of claim 16, wherein the reaction product of (a1) and (a2) has a conversion of the alkoxyl groups of the component (a1) in the reaction product of the component (a1) and the component (a2) of 50 mol % or more.

19. The composition of claim 16, wherein the number average molecular weight of the reaction product of the component (a1) and (a2) is 300 to 10,000.

20. The composition of claim 16, wherein the component (a2) is a compound having two or more hydroxyl groups in the molecule.

21. A process for forming a tantalum oxide film, comprising
applying the composition of claim 16 to a substrate, and subjecting the substrate to at least one of a heat treatment and a photo-treatment to form a tantalum oxide film.

22. The process of claim 21, wherein applying is carried out at an ambient humidity of 0.5 g/m$^3$ or less.

23. A tantalum oxide film formed by the process of claim 21.

24. An insulating film for semiconductor devices which is the tantalum oxide film of claim 23.

25. The composition as claimed in claim 16, wherein the ester of the orthocarboxylic acid (B) is selected from the group consisting of trimethylorthoformate, triethylorthoformate, trimethylorthobenzoate and mixtures thereof.

26. The composition as claimed in claim 16, wherein the ester of the orthocarboxylic acid (B) is present in an amount of 0.05 to 50 wt. %.

27. The composition as claimed in claim 16, wherein the ester of the orthocarboxylic acid (B) is present in an amount of from 0.5 to 20 wt. %.

28. The process as claimed in claim 8, wherein the tantalum oxide film has a leak current of from 10$^{-8}$ A/cm$^2$ to 10$^{-9}$ A/cm$^2$.

29. The process as claimed in claim 21, wherein the tantalum oxide film has a leak current of from 10$^{-8}$ A/cm$^2$ to 110$^{-9}$ A/cm$^2$.

* * * * *